(12) United States Patent
Deo et al.

(10) Patent No.: US 6,842,633 B1
(45) Date of Patent: Jan. 11, 2005

(54) CLIP ARRANGEMENT FOR PORTABLE ELECTRONIC APPARATUS HOUSING ASSEMBLY

(75) Inventors: Hammond Deo, Middlesex (GB); Mark Hutchison, Hampshire (GB)

(73) Assignee: Nokia Mobile Phones Ltd., Espoo (FI)

( * ) Notice: Subject to any disclaimer, the term of this patent is extended or adjusted under 35 U.S.C. 154(b) by 465 days.

(21) Appl. No.: 09/712,820

(22) Filed: Nov. 14, 2000

(51) Int. Cl.$^7$ ............................................... H04B 1/38
(52) U.S. Cl. ........................ 455/575.8; 455/550.1; 455/566; 379/433.11; 379/433.01
(58) Field of Search ..................... 455/90, 566, 575, 455/550, 347, 567, 550.1, 575.1, 575.6, 45.7, 346; 379/433.11, 433.01; 248/309.1; 312/7.1

(56) References Cited

U.S. PATENT DOCUMENTS

| | | | | |
|---|---|---|---|---|
| 4,803,473 A | * | 2/1989 | Taylor | 340/693.5 |
| 5,210,532 A | * | 5/1993 | Knoedler et al. | 340/825.69 |
| 5,233,506 A | | 8/1993 | Semenik et al. | |
| 5,535,274 A | * | 7/1996 | Braitberg et al. | 379/446 |
| 5,666,274 A | * | 9/1997 | Corso | 361/814 |
| 5,697,071 A | * | 12/1997 | Fan | 455/575.9 |
| 5,768,370 A | * | 6/1998 | Maatta et al. | 379/433.01 |
| 6,084,962 A | * | 7/2000 | Plenge | 379/433.01 |
| 6,115,620 A | * | 9/2000 | Colonna et al. | 455/569.1 |
| 6,229,993 B1 | * | 5/2001 | Greenaway et al. | 455/575.1 |
| 6,317,588 B1 | * | 11/2001 | Curtis et al. | 455/566 |
| 6,389,268 B1 | * | 5/2002 | Snyder | 455/90.1 |
| 6,463,263 B1 | * | 10/2002 | Feilner et al. | 455/90.1 |

FOREIGN PATENT DOCUMENTS

| | | |
|---|---|---|
| CH | 659164 | 12/1986 |
| DE | 9416849 | 3/1995 |
| DE | 19605373 | 8/1997 |
| DE | 29911091 | 10/1999 |
| EP | 0330744 | 9/1989 |
| EP | 0491270 | 6/1992 |
| EP | 0919734 | 6/1999 |
| GB | 2102874 | 2/1983 |
| GB | 2147653 | 5/1985 |
| GB | 2197383 | 5/1988 |
| GB | 2197383 A | * 5/1988 ............. E05C/3/12 |

OTHER PUBLICATIONS

WPI Abstract Accession No. 99–304876/26 (Windows, Document: EPO919734).
WPI Abstract Accession No. 97–416845 (Windows, Document: DE19605373).

* cited by examiner

*Primary Examiner*—Tilahun Gesesse
(74) *Attorney, Agent, or Firm*—Ware, Fressola, Van Der, Sluys & Adolphson LLP

(57) ABSTRACT

A housing assembly for a mobile telephone comprises a window panel and a front cover, with a clip arrangement which assists in preventing the common problem of the window panel falling out of the front cover. The clip arrangement comprises a rigid clip on the window panel which engages with a beam integrally moulded in the cover. This allows use of a low profile clip which does not extend into the telephone assembly, so permitting strong connections to be made in small assemblies.

20 Claims, 5 Drawing Sheets

CLIP ARRANGEMENT FOR PORTABLE ELECTRONIC APPARATUS HOUSING ASSEMBLY

BACKGROUND OF THE INVENTION

1. Field of the Invention

This invention relates to the field of portable electronic apparatus such as mobile telephones, particularly but not exclusively to a housing assembly including a clip arrangement for securely attaching a display window to a mobile phone cover.

2. Description of Related Art

Figure 1A:
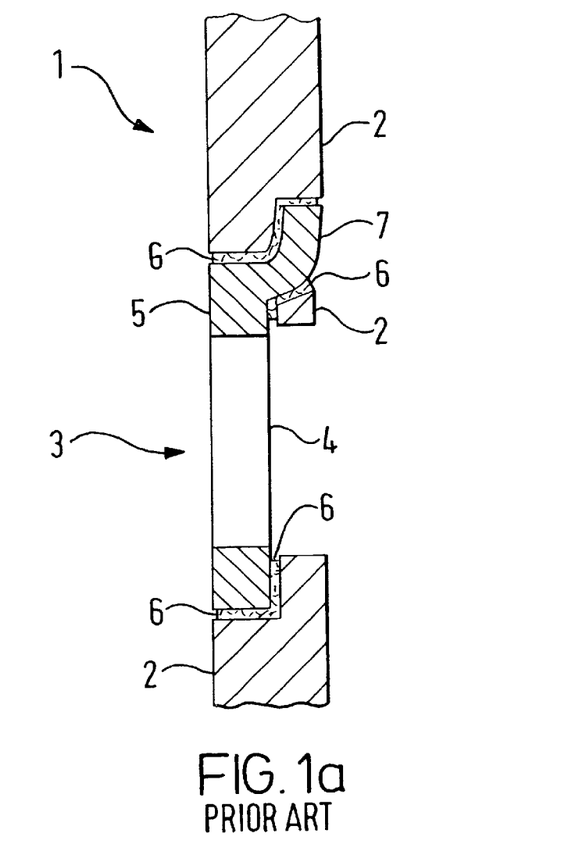
FIG. 1 shows a conventional display window assembly in a mobile telephone.
Figure 1B:
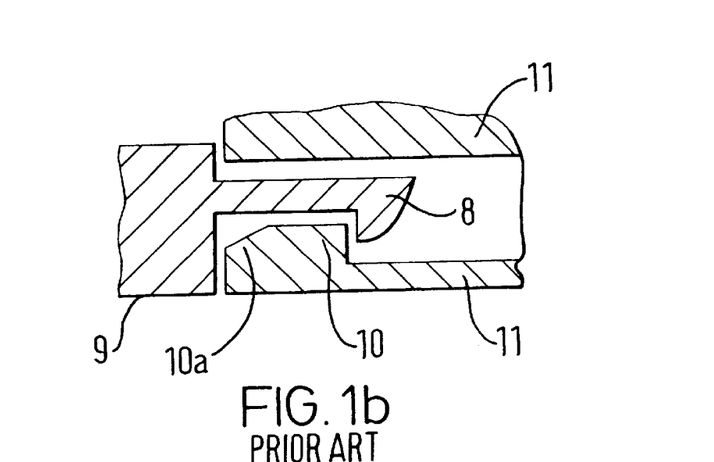
FIG. 1b shows a conventional deformable clip arrangement.

The majority of conventional mobile telephones have a liquid crystal display for displaying information relating to mobile phone operation, such as the telephone number being dialled, address lists, phone settings and so on. The display is viewed through a protective plastic window, which forms part of the front housing of the phone. FIGS. 1a and 1b illustrate several conventional techniques for assembling parts of a housing. For example, referring to FIG. 1a, the front housing 1 of a mobile telephone includes a cover portion 2 and a window panel 3, comprising a clear window 4 and a frame 5. The window panel 3 is held in the cover portion 2 by layers of adhesive 6, but this often fails at the higher operational temperatures which may result from prolonged phone use. Tabs 7 can be used to aid retention but often snap off if the phone is accidentally dropped. Furthermore, tabs can only be used at one end of the window panel 3 to allow assembly, so that the opposite end of the panel 3 will peel away from the cover portion 2 and ultimately drop out if the adhesive 6 fails.

Referring to FIG. 1b, a further known type of clipping arrangement comprises a deformable clip 8 in one housing part 9 which rides over a lip 10a of a retaining member 10 in the mating housing part 11 and clips behind the retaining member 10 to hold the respective housing parts 9, 11 together. Such clips are generally required to be long and thin in section to achieve the appropriate degree of deformation, as a result of which they snap off easily. In addition, the length of the clip requires significant clearance in the mating part 11, which is not practical in small assemblies.

Clip arrangements are also known in which additional components such as metal spring arrangements are used to provide clip retaining features in one part of the housing. Such solutions increase manufacturing complexity and therefore the cost per unit manufactured.

SUMMARY OF THE INVENTION

According to the present invention, there is provided a housing assembly for portable electronic apparatus comprising first and second housing portions, the first portion including a substantially rigid clip and the second portion including a receiving arrangement for the clip, the receiving arrangement comprising a displaceable element integrally moulded with the second portion, and the clip comprising means for displacing the element of the second portion, and means for retaining the element between the first portion and the displacing means.

The displaceable element can be an elongate beam, which can be defined by first and second slots in the second portion. To assist with location of the first portion onto the second portion, the first slot can be configured to receive the clip only at a part thereof. Further, the beam can have a chamfered edge to assist with movement of the clip over the beam during assembly.

The integrally moulded displaceable element obviates the need for additional components and allows the use of a substantially rigid clip, which is less likely to snap. Since a long clip is therefore not required, a low profile clip can advantageously be used to join two substantially planar housing portions, so that, when assembled, the clip does not protrude substantially beyond the plane of the second portion. This can have particular advantages in the manufacture of small assemblies where space is at a premium.

In the case of a mobile telephone, the first portion can be a window panel and the second portion the front cover of the telephone.

The clip arrangement can be used together with an adhesive and can have the significant advantage that the clip arrangement is itself capable of holding in the window after the adhesive has failed. The window portion can also include one or more tabs for engaging with the cover. The tabs and the clip are preferably arranged at opposite sides of the clear window in the window panel. Even if the tabs snap off, for example when the apparatus is dropped, the clip will remain to hold the window panel. The clip can be reinforced to ensure that it does not deform, so strengthening it further.

BRIEF DESCRIPTION OF THE SEVERAL VIEWS OF THE DRAWINGS

Embodiments of the invention will now be described by way of example, with reference to the accompanying drawings, in which.

DETAILED DESCRIPTION OF THE INVENTION

Figure 2:
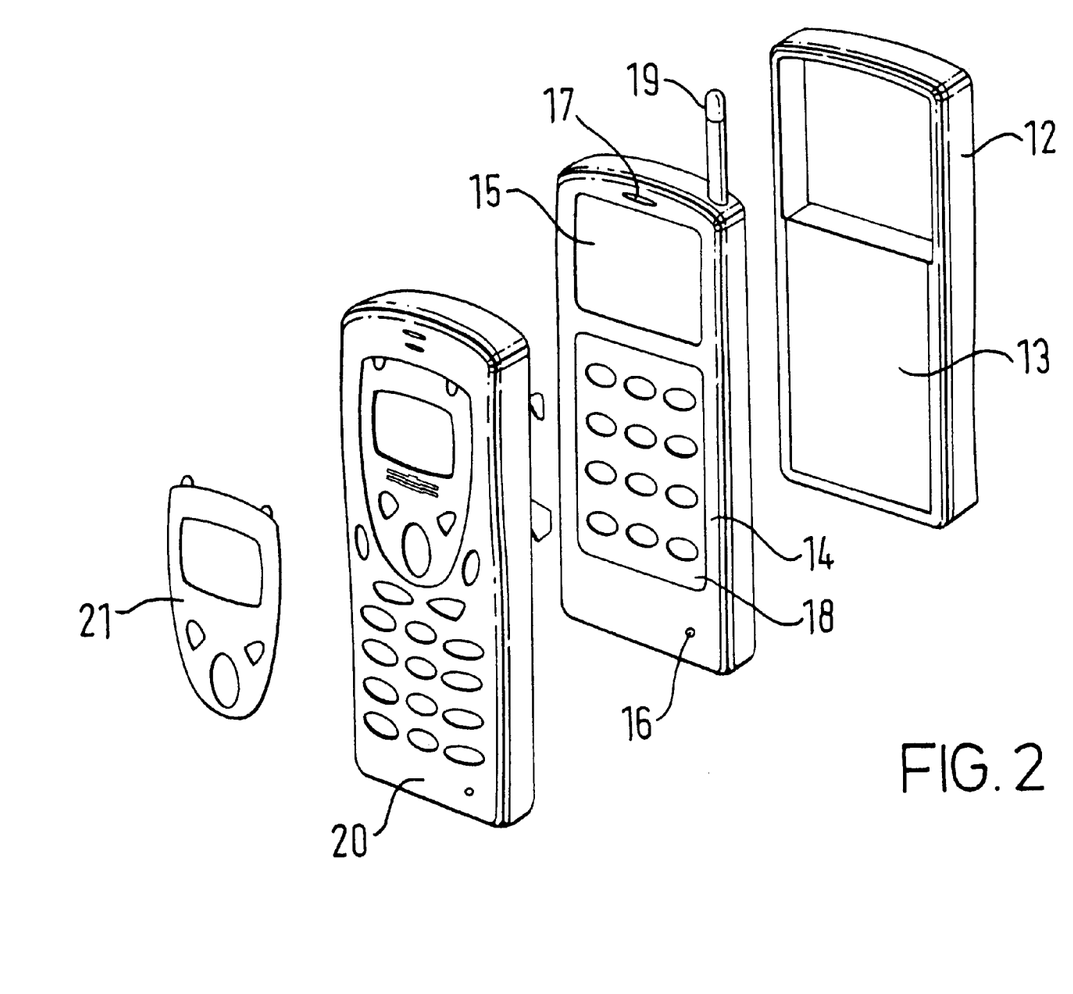
FIG. 2 is an exploded view of a mobile telephone according to the invention.

Referring to FIG. 2, a mobile telephone which includes a housing assembly according to the invention comprises a rear housing 12 including a battery pack 13, mobile telephone circuitry 14 including an LCD display panel 15, microphone 16, ear-piece 17, keypad 18 and antenna 19, a front housing portion referred to in this specification as a front cover 20 and a window panel 21 which is designed to fit into the front cover so that the LCD display panel 15 is visible through it. The telephone circuitry 14 is of the type which is well known in the art, for example in the Nokia range of mobile telephones.

Figure 3:
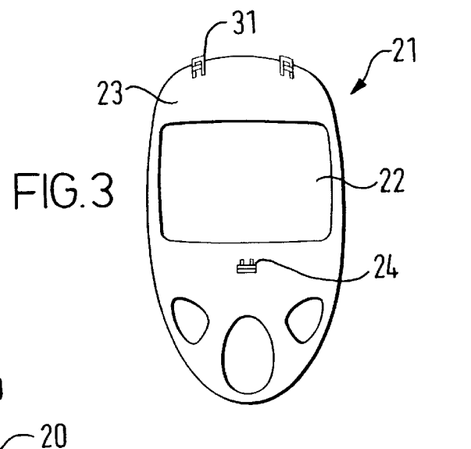
FIG. 3 is a rear view of the window panel of the telephone of FIG. 2 showing the clip which forms part of the clip arrangement according to the invention.

Referring to FIG. 3, the window panel 21 is a single piece plastic moulding having a clear window 22 and a surround 23, and is made by conventional moulding techniques using conventional materials. A low profile clip 24 is integrally moulded with the panel 21 so as to extend essentially perpendicular to the plane of the panel. The clip is shown in more detail in FIG. 4.

Figure 4:
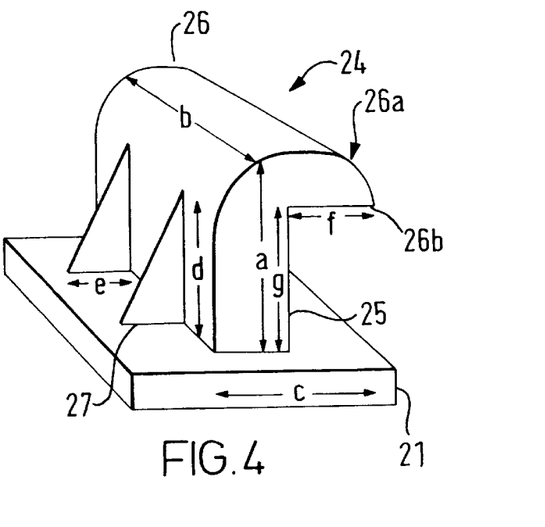
FIG. 4 is an enlarged view of the clip shown in FIG. 3.

Referring to FIG. 4, the clip 24 comprises a body portion 25 extending from the panel 21 and a barbed head portion 26 having a rounded leading edge 26a and a trailing edge 26b. Reinforcing struts 27 are provided for additional strength. The dimensions of the clip 24 are, for example, approximately 1.8 mm high (a), 3 mm wide (b) and 1.8 mm long (c). The reinforcing struts 27 are, for example, 1.5 mm high (d) and 1 mm long (e). The barbed part of the clip head 26 is approximately 0.8 mm long (f) and 1.5 mm (g) from the surface of the window panel 21.

Figure 5:
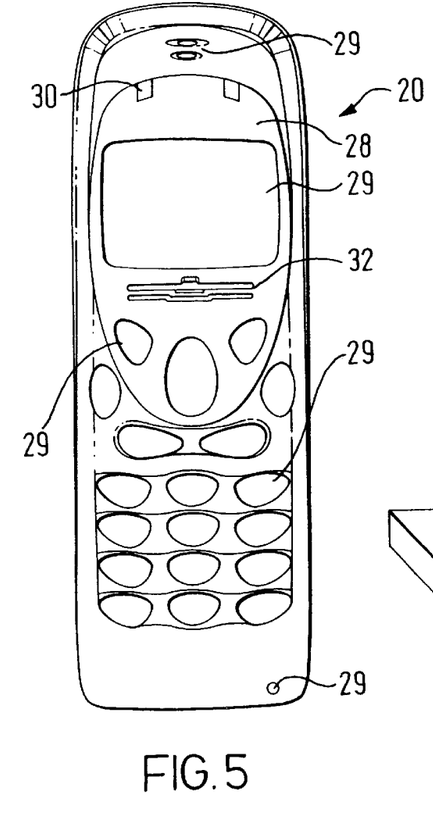
FIG. 5 is a front view of the cover portion of the telephone of FIG. 2 showing details of the clip receiving arrangement which forms part of the clip arrangement according to the invention.

Referring to FIG. 5, the front cover 20 is a moulded plastic unit having a recessed portion 28 for receiving the window panel 21. The recess is, for example, approximately 1.5 mm deep. The front cover 20 includes cut-outs 29 to accommodate the LCD display panel 15, microphone 16, earpiece 17 and keypad 18, as well as tab receiving slots 30 to accommodate corresponding tabs 31 on the window panel 21. The front cover 20 also includes a clip receiving arrangement 32 which is shown in more detail in FIGS. 6a and 6b.

Figure 6A:
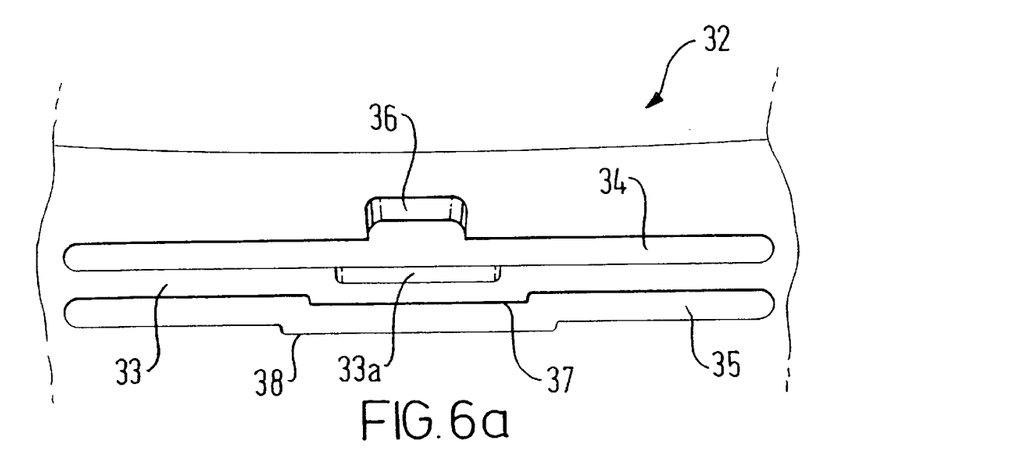
FIG. 6a is an enlarged front view of the clip receiving arrangement shown in FIG. 5.

Referring to FIG. 6a, the clip receiving arrangement 32 is integrally moulded with the front cover and comprises a generally elongate beam 33 defined by two slots 34, 35, one on either side of the beam.

The beam length is, for example, approximately 2 cm to allow the beam to be sufficiently flexible so that it deforms without breaking on contact with the clip 24. It has, for example, a square cross-section 1 mm×1 mm. The first slot 34 is wide enough to receive the clip only at a central portion 36 thereof, the central portion being, for example, approximately 5 mm long and 2 mm wide, the remainder of the slot being 1 mm wide. The second slot 35 is sufficiently wide, for example, 1 mm, to accommodate the beam when it is deflected from its usual position by the action of the clip 24.

The beam 33 has a chamfered portion 33a which cooperates with the rounded edge 26a of the clip head 26 to assist the clip head 26 to ride over the beam when the clip first contacts it during assembly. The beam can be formed with a thicker portion 37 in the region of the chamfered portion to strengthen it. In this case, the second slot 35 is formed with an offset portion 38 at the level of the thicker portion, to receive the beam 33 as it flexes.

Figure 6B:
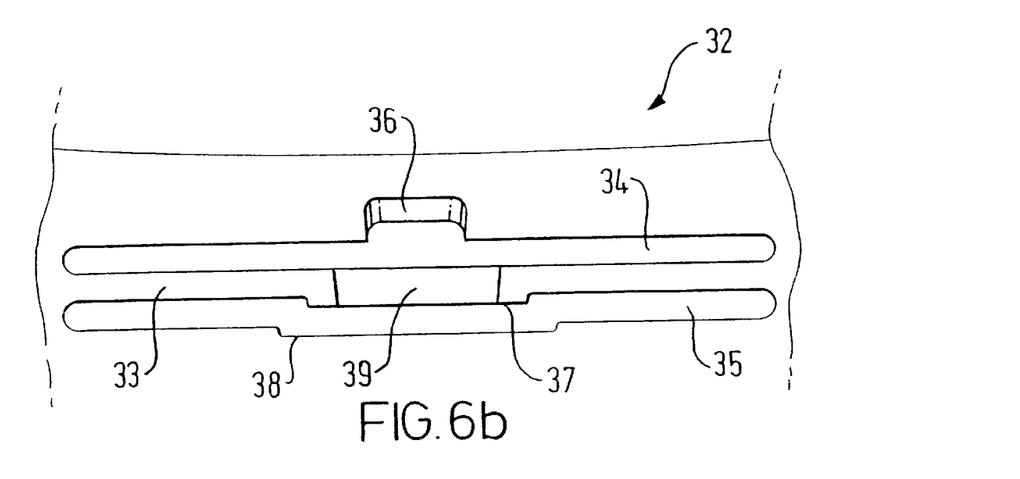
FIG. 6b is an enlarged rear view of the clip receiving arrangement shown in FIG. 5.

Referring to FIG. 6b, the beam has a recess 39 for receiving the clip head 26 to assist in ensuring that the head does not protrude significantly into the assembly. The recess is, for example, 6 mm long and 0.3 mm deep.

Figure 7A:
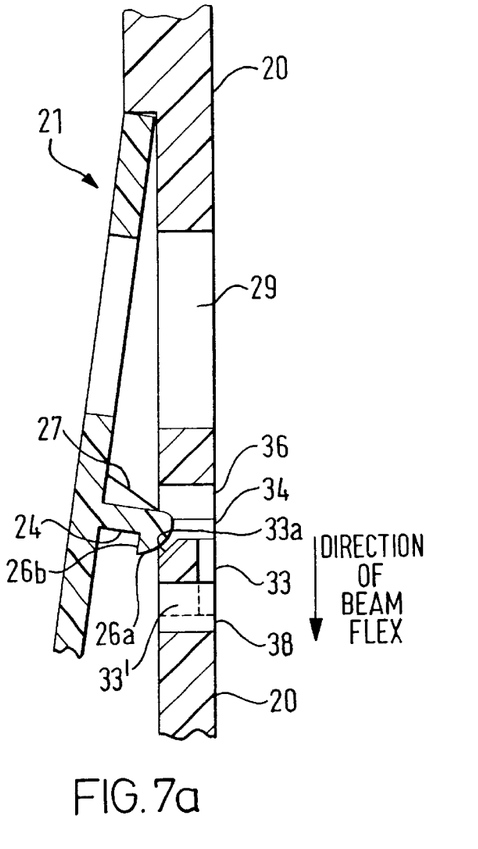
FIG. 7a is an enlarged cross-sectional view showing a first step in the assembly of the window panel of FIG. 3 to the cover portion of FIG. 5.
Figure 7B:
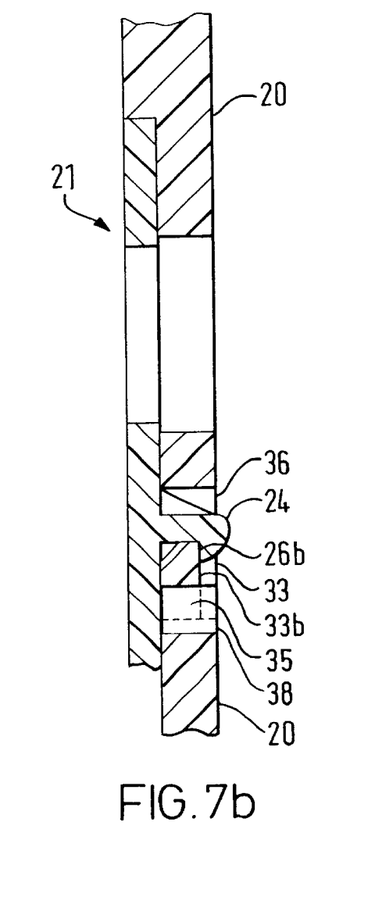
FIG. 7b is an enlarged cross-sectional view showing the completed assembly of the window panel of FIG. 3 to the cover portion of FIG. 5.

The operation of the clip arrangement will now be described in detail, with reference to FIGS. 7a and 7b.

To assemble the window panel 21 to the front cover 20, the tabs 31 are first fitted into the tab slots 30. These then act as a pivot point allowing the panel 21 to be pivoted into position over the front cover 20. Referring to FIG. 7a, as the clip head 26a comes into contact with the chamfered portion 33a of the beam 33, it displaces the beam in the direction indicated in FIG. 7a, referred to in this specification as downwards, since this generally corresponds to the normal orientation in which the phone would be held in use. The displaced beam 33', shown in dotted outline, is accommodated in the second (lower) slot 35, 38. Once the trailing edge 26b of the clip head 26 clears the side of the beam 33b furthest from the window panel, the resilience of the beam material moves the beam upwards so that it locates between the clip head 26 and the surface of the window panel 21 from which the clip 24: extends, as shown in FIG. 7b. The window panel 21 is now firmly secured to the front cover 20. An adhesive can be used between the window panel and the front cover in conjunction with the tabs and clipping arrangement.

In an alternative embodiment of the invention, the tabs 31 on the window panel 21 and the corresponding tab slots 30 in the front cover 20 are omitted, the window panel 21 fitting relatively tightly in the recessed portion 28 of the front cover and being held in place by the clip arrangement 24, 32 in conjunction with adhesive. It will be evident to a person skilled in the art that various other modifications to the form, details and dimensions of the clip arrangements may be made within the scope of the invention.

It will be appreciated that while the invention has been described in relation to mobile telephones, it can be used with any sort of portable electronic apparatus, for example, hand held computers and portable measuring equipment.

What is claimed is:

1. A housing assembly for portable electronic apparatus comprising first and second housing portions, the first portion including a substantially rigid clip and the second portion including a receiving arrangement for the clip, the receiving arrangement comprising a displaceable element integrally moulded with the second portion, and the clip comprising means for displacing the element of the second portion, and means for retaining the element between the first portion and the displacing means, and wherein the element comprises an elongate beam defined by first and second elongate slots in the second portion and wherein the first elongate slot is configured to receive the clip and the second elongate slot is configured to receive the beam on displacement by the clip.

2. An assembly according to claim 1, wherein the beam includes a chamfered edge to facilitate passage of the clip over it.

3. An assembly according to claim 2, wherein the beam is reinforced in the region of the chamfered edge.

4. An assembly according to claim 1, wherein only a part of the first elongate slot is capable of receiving the clip.

5. An assembly according to claim 1, wherein the clip includes a clip head and a clip body, the head, body and the first housing portion forming a receptacle for receiving the beam.

6. An assembly according to claim 5, wherein the beam includes a recess for receiving the clip head.

7. An assembly according to claim 1, wherein the first and second portions are substantially planar.

8. An assembly according to claim 7, wherein the clip extends substantially perpendicularly from the plane of the first portion.

9. An assembly according to claim 7, wherein, in the assembled state, the clip does not protrude substantially beyond the plane of the second portion.

10. An assembly according to claim 1, wherein the first portion comprises a window panel for a mobile telephone and the second portion comprises a front housing for the mobile telephone.

11. An assembly according to claim 10, further comprising tabs on the window panel for engaging with tab receiving slots in the front housing.

12. An assembly according to claim 11, wherein the window panel includes a window for viewing a display of a mobile telephone, and the tabs and the clip are located on opposite sides of the window.

13. A method of assembling a housing assembly comprising first and second housing portions, the first portion including a substantially rigid clip and the second portion including a receiving arrangement for the clip, the receiving arrangement comprising a displaceable element integrally moulded with the second portion wherein said element is defined by first and second elongate slots in the second portion, and the clip comprising means for displacing the element of the second portion, and means for retaining the element between the first portion and the displacing means, the method comprising moving the first portion towards the second portion such that the displacing means on the clip of the first portion is received in the first elongate slot and displaces the element of the second portion into the second elongate slot and then retains the element between the first portion and the displacing means.

14. A mobile telephone having a housing assembly comprising first and second housing portions, the first portion including a substantially rigid clip and the second portion including a receiving arrangement for the clip, the receiving arrangement comprising a displaceable element integrally moulded with the second portion wherein said element comprises an elongate beam defined by first and second elongate slots in the second portion, and the clip comprising means for displacing the element of the second portion wherein the first elongate slot is configured to receive the clip and the second elongate slot is configured to receive the beam on displacement by the clip, and means for retaining the element between the first portion and the displacing means.

15. A mobile telephone according to claim 14, wherein the first and second portions are substantially planar.

16. A mobile telephone: according to claim 15, wherein the clip extends substantially perpendicularly from the plane of the first portion.

17. A mobile telephone: according to claim 15, wherein, in the assembled state, the clip does not protrude substantially beyond the plane of the second portion.

18. A mobile telephone: according to claim 4, wherein the first portion comprises a window panel for a mobile telephone and the second portion comprises a front housing for the mobile telephone.

19. A mobile telephone according to claim 18, further comprising tabs on the window panel for engaging with tab receiving slots in the front housing.

20. A mobile telephone according to claim 19, wherein the window panel includes a window for viewing a display of a mobile telephone, and the tabs and the clip are located on opposite sides of the window.

* * * * *

UNITED STATES PATENT AND TRADEMARK OFFICE
CERTIFICATE OF CORRECTION

PATENT NO. : 6,842,633 B1
DATED : February 9, 2005
INVENTOR(S) : Deo et al.

It is certified that error appears in the above-identified patent and that said Letters Patent is hereby corrected as shown below:

Column 6,
Lines 9, 12 and 15, after "telephone" ":" should be deleted.
Line 15, "claim 4" should be -- claim 14 --.

Signed and Sealed this

Twenty-eighth Day of June, 2005

JON W. DUDAS
*Director of the United States Patent and Trademark Office*

UNITED STATES PATENT AND TRADEMARK OFFICE
CERTIFICATE OF CORRECTION

PATENT NO.   : 6,842,633 B1
DATED        : February 9, 2005
INVENTOR(S)  : Deo et al.

It is certified that error appears in the above-identified patent and that said Letters Patent is hereby corrected as shown below:

<u>Title page,</u>
Item [30], Foreign Application Priority Data, please add the following:
-- Dec. 21, 1999 (GB)        United Kingdom           9930246.5 --.

Signed and Sealed this

Twenty-fifth Day of October, 2005

JON W. DUDAS
*Director of the United States Patent and Trademark Office*